United States Patent [19]
Konrad

[11] Patent Number: 5,883,489
[45] Date of Patent: Mar. 16, 1999

[54] HIGH SPEED DEEP WELL PUMP FOR RESIDENTIAL USE

[75] Inventor: Charles E. Konrad, Roanoke, Va.

[73] Assignee: General Electric Company, Schenectady, N.Y.

[21] Appl. No.: 723,202

[22] Filed: Sep. 27, 1996

[51] Int. Cl.⁶ .................................................. H02P 5/40
[52] U.S. Cl. ...................... 318/807; 318/805; 318/810; 417/36; 417/22
[58] Field of Search ............................ 318/227, 800–829, 318/729, 778, 798, 705, 430–434, 447, 606, 424, 723; 166/68.5; 417/53, 424, 42–45; 361/23–30, 31, 32, 33; 415/501

[56] References Cited

U.S. PATENT DOCUMENTS

| | | | |
|---|---|---|---|
| 3,753,064 | 8/1973 | Agarwal et al. | 318/227 |
| 3,976,919 | 8/1976 | Vandevier et al. | 317/47 |
| 4,000,446 | 12/1976 | Vandevier et al. | 317/36 |
| 4,001,666 | 1/1977 | Grenfell | 322/4 |
| 4,021,700 | 5/1977 | Ellis-Anwyl | 361/28 |
| 4,284,943 | 8/1981 | Rowe . | |
| 4,317,074 | 2/1982 | Erth | 318/808 |
| 4,538,220 | 8/1985 | Gyugyi . | |
| 4,626,763 | 12/1986 | Edwards | 318/811 |
| 4,678,404 | 7/1987 | Lorett et al. | 417/45 |
| 4,845,418 | 7/1989 | Conner | 318/778 |
| 5,160,244 | 11/1992 | Kuwabara et al. . | |
| 5,350,992 | 9/1994 | Colter . | |
| 5,571,240 | 11/1996 | Yamauchi et al. . | |
| 5,580,221 | 12/1996 | Triezenberg . | |
| 5,668,457 | 9/1997 | Motamed | 318/606 |

*Primary Examiner*—Paul Ip
*Attorney, Agent, or Firm*—Wayne O. Traynham

[57] ABSTRACT

A power control system in combination with a three-phase AC motor coupled to a water pump enables the operation of the motor at speeds up to 10,800 RPM so as to provide improved pumping capacity with a smaller motor and smaller pump. The control system supplies AC power to the motor with a frequency of the power being increased at a first high rate up to a frequency at which pump pressure is about equal to a value at which water is being pumped from the outlet pipe of the pump. Thereafter, AC power frequency is increased to the second, slower rate up to a maximum operating frequency of the motor. During the time that frequency of the AC power is being increased, motor current is continuously monitored and compared to a maximum allowable current. If monitored current exceeds allowable current, the frequency of operation is decreased until monitored current is less than the allowable current. Thereafter, frequency is again increased so long as monitored current is less than allowable current. Preferably, the allowable current is set to maintain operation of the motor at about its pullout torque level throughout the range of operation.

26 Claims, 3 Drawing Sheets

FIG_1

FIG_4

HIGH SPEED DEEP WELL PUMP FOR RESIDENTIAL USE

BACKGROUND OF THE INVENTION

The present invention relates to electric motor driven submersible pumping systems and, more particularly, to a method and apparatus for controlling operation of a submersible pump or other variable torque load.

Deep well, residential service, submersible pumps presently available in the market are driven with two pole, alternating current (AC) induction motors which have been packaged to survive immersion in the well. The stator portion of the motor is encapsulated with an epoxy making it impervious to moisture and the encapsulated motor is enclosed in a housing assembly with water lubricated bearings. The enclosure is then filled with ethylene-glycol. The motor output shaft is directly coupled to a shaft of a pump which has a stack of impellers to force water into an outlet pipe. The outlet pipe has a pressure level determined by the depth of the well and the pressure level at the associated residence. A check valve is included in the pump outlet pipe to prevent water draining into the well when the pump outlet pressure is less than the pressure in the outlet pipe.

The most popular motor rating for residential water pumping systems is ¾ horsepower with a 1.6 service factor having a net continuous rating of 1.2 hp. The motor and pump are coupled in line and typically fit into an outer casing 4" in diameter with a total length of the assembly of about three to four feet. The pump/motor assembly with wiring and supply pipe attached is lowered into the well to a depth that keeps it a short distance from the bottom to avoid sand and other contaminants from fouling the water inlet. Maximum operating depth can be up to 400 feet and the pump capacity is preferably sufficient to maintain 60 psi plus the pressure needed to overcome the 400 foot head.

The pumping system at the top of the well includes a storage tank with a spring loaded or air initiated bladder to minimize the change in pressure with dropping water level in the tank as water is used by the residence. A pressure switch with adjustable hysteresis is interfaced to the storage tank to switch the pump "ON" when the pressure drops below a minimum set point and "OFF" when the pressure reaches a maximum set point.

There are several deficiencies with the present commercially available design including, for example, the following: (1) a four inch pump-motor diameter requires a five inch well casing at a substantial well drilling cost; (2) if a well is pumped dry, the pump may be damaged because the bearings are water lubricated and the lack of water leads to bearing failure unless a flow restrictor is added to the waterline at the well head to prevent the output flow from exceeding the well recovery rate; (3) sand, stone chips or other debris in the well may cause the pump to seize or bind leading to a stalled motor condition that may cause motor overheating and damage; (4) if line voltage is low, the motor is forced to operate at less than rated magnetic flux, thus requiring more current to produce the same torque leading to motor overheating and the possibility of eventual failure; (5) starting the motor by connecting it across the AC power line results in a significant surge in input current with each start and frequent restarts, such as those experienced when the power is frequently interrupted during thunderstorms, can also lead to motor overheating and failure; and (6) because of the heating penalty associated with each start, the hysteresis in the pressure switch must be increased to a value great enough to ensure that the motor doesn't restart too frequently forcing the homeowner to endure pressure variations of as much as 50% between pump starts.

An AC induction motor typically has a pullout torque (maximum torque on the motor characteristic curve) which is 3 to 4 times the rated torque and a current at stall which is 5 to 6 times the rated current. In an application where the motor is started by simply connecting it across the power source using a switch or contactor, there is an initial inrush current of 5 to 6 times the rated current which gradually reduces to rated current as the motor accelerates to rated speed. During the acceleration, the torque increases with increased speed until the pullout torque speed is reached, after which the torque and current begin to fall as the speed increases further. The speed will settle to a constant value when the motor torque is equal to the load torque.

Torque loads presented to the motor by pumps and other variable speed loads, such as compressors and fans, vary with shaft speed. With these types of loads, the load torque at zero speed is very small and increases with increasing speed. The torque available to accelerate the load is the difference between the motor torque and the load torque. The ideal fan torque characteristic is a torque which varies with the square of speed. Pumps and compressors are oftentimes similar to the fan load torque, but in some instances may depart significantly from the ideal characteristics due to variations in back pressure, for example. In general, torque can be considered to be a function of slip frequency where a linear approximation has sufficient accuracy for most applications. If motor speed is known from a tachometer or other speed measuring device, then all a controller must do in order to produce a desired level of torque at that speed is to calculate what frequency would place the synchronous speed at the rotor speed, and then add to that the slip frequency needed to produce the desired torque. For example, if the motor is running at 1800 rpm, 30 Hz excitation would make this the synchronous speed for a two pole motor. Typically, a slip frequency of 3 Hz provides 200% of rated torque so that providing 33 Hz excitation at this speed will result in 200% torque. This principle of control is usually referred to as slip control and is well known in the art.

In highly competitive markets, a tachometer or other speed sensor adds too much cost to a controller, and systems are built without speed sensing. Without speed sensing, the speed must be changed slowly to ensure that the motor continues to operate at slip frequencies equal to or less than the frequency corresponding to pullout torque. The reasoning for this is that when the frequency source is an electronic unit where the maximum current determines the controller cost, maximum current limit is usually set at about twice the required continuous current rating by cost constraints. If the frequency is allowed to increase significantly faster than the motor speed, the system may get into a state where the slip frequency is so high that the current limit causes the maximum torque developed to be significantly less than rated torque causing the motor to stall. If there is no speed measuring device, there may be no way for the controller to recognize that a stall has occurred and current will continue to be supplied at the limit value causing the motor to overheat and be damaged. While the description of this concern was based upon increasing the frequency too fast, the same state may arise as the result of load torque impulses, sticky shafts, and other anomalies that cause the motor shaft speed to drop.

SUMMARY OF THE INVENTION

Among the several objects of the present invention may be noted the provision of a pumping system which has the pumping capacity of existing systems but is about ⅓ the physical size of existing systems; the provision of a pumping system which alerts a user of low well water levels and a stalled motor; the provision of a pumping system which can be agitated to overcome stalls caused by trapped debris or other forms of binding interference; the provision of a pumping system which can operate under low voltage conditions; the provision of a pumping system which can accommodate frequent restarts; the provision of a pumping system with improved pressure regulation; and the provision of an improved electric motor control system for AC electric motors driving loads in which load torque varies with motor shaft speed.

The above and other objects, features and advantages will be in part pointed out and otherwise become apparent from the description to follow of applicant's improved pumping system and motor control. In one form, the invention is illustrated as a pulse width modulation (PWM) power control system in combination with a three-phase AC motor coupled to a water pump. The control system is arranged to provide PWM control of the motor so as to enable operation of the motor at speeds up to 10,800 RPM. The motor and associated pump are reduced in physical size to about ⅓ the volume of conventional motor/pump systems running at conventional speeds of less than 3600 RPM. In the illustrated control system, motor operation is responsive to water pressure at a bladder tank wherein a pressure sensor provides a signal indicative of pressure at a first lower setpoint for initiating motor operation and a signal indicative of pressure at a second upper setpoint for disabling motor operation. The control system is preferably located outside the well and includes a rectifier for converting power from an AC power line to direct current (DC) power and a controllable inverter for converting the DC power to variable frequency AC power.

In operation, the control system supplies AC power to the motor with the frequency of the power being increased at a first high rate up to a frequency at which pump pressure is about equal to a value at which water is pumped into the outlet pipe by the pump. Thereafter, AC power frequency is increased at a second, slower rate up to the maximum operating frequency. During the frequency increasing operation, motor current is monitored and compared to a predetermined allowable current. If monitored current exceeds the allowable current, the frequency is decreased until monitored current is less than the allowable current. Thereafter, the frequency is again allowed to increase so long as monitored current is less than allowable current.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
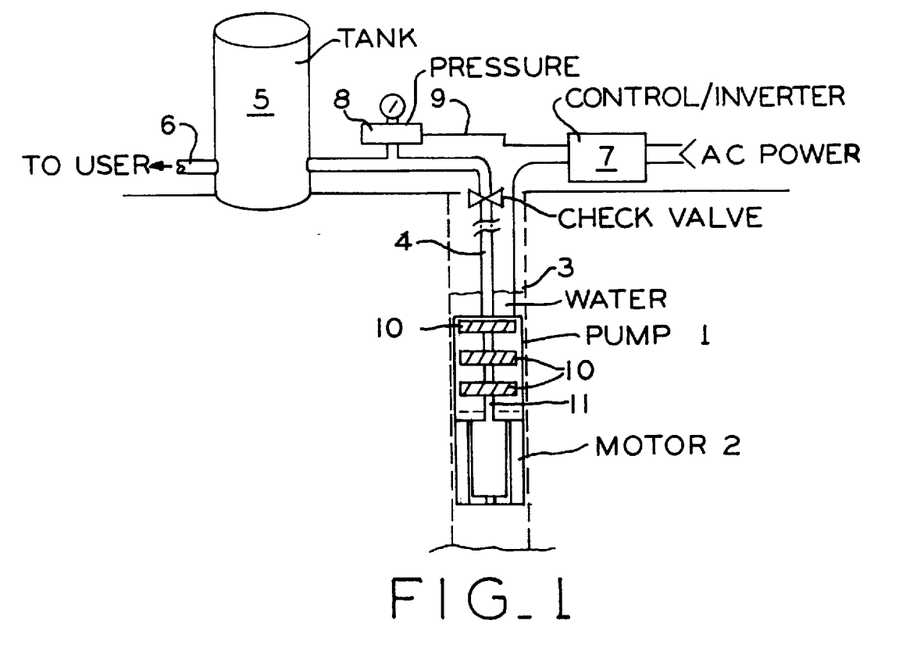
FIG. 1 is a simplified illustration of a conventional water pumping system with which the present invention may be used.

FIG. 1 illustrates an exemplary deep well pumping system incorporating the teachings of the present invention. A pump 1 and AC induction motor 2 are located within a bore 3 at a depth which may be as deep as about 400 feet. Water in the bore 3 can be pumped through pipe 4 to a bladder type storage tank 5 from where it is distributed to a residential user via pipe 6. A control 7 responds to water pressure signals from pressure sensor 8 via line 9 for providing variable frequency AC excitation to motor 2. The control 7 receives power from conventional AC power utility lines. When water pressure is less than some preselected low set point, the sensor 8 provides a first signal which causes the control 7 to energize pump motor 2. When water pressure rises above some preselected high set point, sensor 8 provides a second signal which causes control 7 to remove excitation from motor 2.

Pump 1 is typically a centrifugal pump comprising a plurality of impellers 10 stacked on a common shaft 11. It has been found that the number of impellers needed to produce a given flow rate at a given pressure is inversely proportional to impeller speed. More particularly, if the impeller speed is increased by a factor of 3, the number of impellers can be reduced by the same ratio and produce the desired flow rate and pressure. Furthermore, it is generally known that motor power is equal to a constant times motor speed multiplied by motor volume. In other words, if motor speed is increased by a factor of 3, motor volume can be decreased by a factor of 3 and still yield the same output power. Accordingly, increasing motor speed will allow both the motor and pump to be reduced in size with concomitant reduction in cost. Further, installation cost may be reduced since the bore diameter for the well may be smaller.

Operating the motor 2 at a higher speed, e.g., at 10,800 RPM rather than the conventional 3600 RPM, requires an excitation frequency of 180 Hz. Generating AC power at frequencies higher than normal power utility frequency, i.e., 60 Hz, requires an inverter. Preferably, such an inverter should be incorporated in control 7 and the total cost of control 7 should be sufficiently low so that the system cost (pump, motor and control) does not exceed the cost of a conventional 60 Hz system. The control 7 should also provide capability for minimizing pressure variations in the residential water system and provide motor protection functions.

Figure 2:
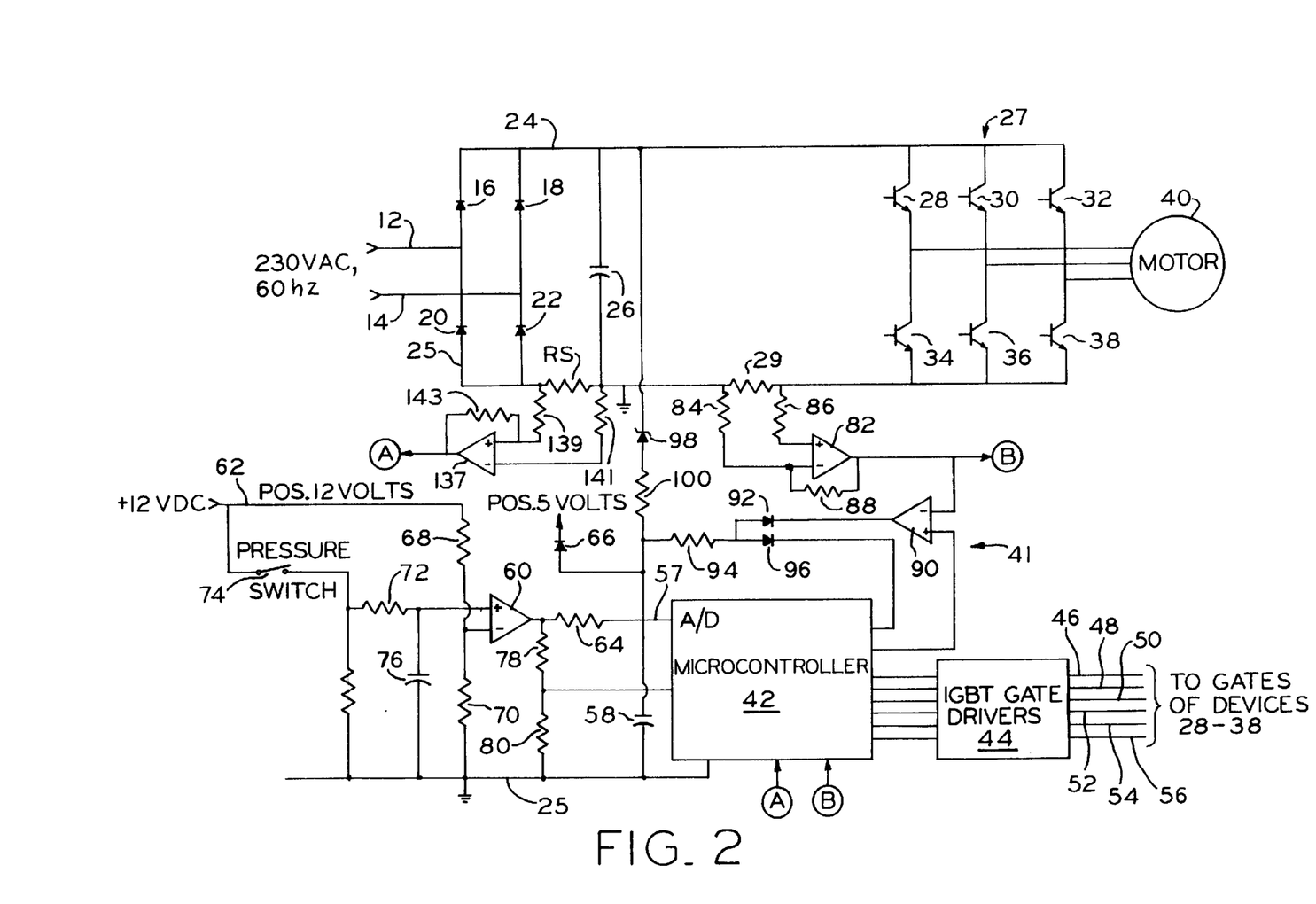
FIG. 2 is a simplified electrical schematic diagram of a control system for the water pumping system of FIG. 1 incorporating the teachings of the present invention.

Turning now to FIG. 2, there is shown a simplified schematic diagram of a motor power circuit and controller for use as control 7 which addresses the problems outlined above. The system is coupled to AC power from a conventional utility electrical system supplying a nominal 220 VAC at 60 Hz (although it should be noted that a source of 300 volts DC is also usable) via the two power input mains 12,14 connected to AC input points on a bridge rectifier circuit comprised of diodes 16, 18, 20 and 22. The cathode terminals of diodes 16, 18 are connected to a positive bus 24, and the anode terminals of diodes 20, 22 are connected to a negative bus 25. A bus filter capacitor 26 is connected between the positive bus and the negative bus to allow a path for reactive power flow from an inductive load, i.e., all of the power flow in the negative and positive bus rails on the left side of the capacitor 26 (rectifier to capacitor) is real power while the power flow in the positive and negative rails on the right side of the capacitor 26 (capacitor to load circuit) is comprised of both real and reactive power components. The positive bus 24 is connected to a positive voltage side of an output power bridge 27 comprised of six power devices 28,30,32,34,36 and 38. A negative voltage side of the power bridge 27 is connected to the negative bus 25 via a current sensing resistor 29. The output of the power bridge is connected to the three phase leads of an induction motor 40 representing a reactive load. The rectifier circuit converts the AC line voltage to full wave rectified voltage on bus 24 referenced to bus 25. The power bridge 27 can be operated as an inverter to convert the voltage between buses 24 and 25 to a controlled frequency AC voltage for controlling the speed of motor 40. Bridge 27 can also convert AC power from motor 40 (if motor 40 is operated in a regenerative mode) into DC power which is coupled back into the DC buses 24, 25.

The output power bridge 27 is controlled by a control circuit 41 which includes a microcontroller 42 which supplies gate drive signals to the six power devices 28–38 via an integrated gate driver circuit 44. Three gate drive signal lines 46,48,50 are connected from driver circuit 44 to the three power devices 28,30,32 connected to the positive DC bus 24 and require a source of power which is isolated from the negative bus 25 such as by use of an isolation transformer or other means well known in the art. Three drive signal lines 52,54,56 are connected from driver circuit 44 to the three power devices 34,36,38 which are referenced to the negative side of the output power bridge and do not require isolation.

The microcontroller 42 is supplied with an input signal at A/D input line 57 from a capacitor 58 whose voltage is representative of the desired speed of motor 40. A software program executed by the microcontroller 42 translates the capacitor 58 voltage into a proportional frequency. The microcontroller 42 develops, from the frequency conversion, a set of pulse width modulation (PWM) signals for controlling the switching devices of the output power bridge or inverter 27. The PWM signals are developed in a well known manner by microcontroller 42 and serve to gate the switching devices into and out of conduction in a manner to generate three-phase output power for application to motor 40 wherein the output waveforms appearing at the power input terminals of motor 40 have an approximate sinusoidal configuration at the frequency set by the microcontroller 42. The switching devices may be insulated gate bipolar transistors (IGBT), gate turn-off devices (GTO) or other suitable electronic switching elements. The amplitude of the three-phase voltage applied to motor 40 is controlled such that the root-mean-square (RMS) amplitude of the line-line voltage supplied to the power input terminals of motor 40 is a constant multiplied by the frequency so that the motor is operated in a constant volts per hertz mode. Hence, basic control of the motor 40 involves control of the voltage on capacitor 58.

A differential amplifier 60 provides the basic drive for charging and discharging capacitor 58 to start, accelerate, decelerate, and stop the motor 40. When the voltage at the non-inverting input terminal of amplifier 60 is higher than the voltage at its inverting input terminal, the amplifier output goes to approximately 12 volts, i.e., the voltage on positive bus 62. The capacitor 58 is connected to the output terminal of amplifier 60 through a charging resistor 64 and begins charging toward the amplifier 60 output voltage via resistor 64. However, the capacitor 58 is also connected via a diode 66 to a lower voltage bus 68, e.g., a 5 volt bus. When the voltage on capacitor 58 reaches 5 volts, the diode 66 becomes forward biased and prevents the capacitor voltage from exceeding a level of 5 volts or whatever lower voltage is on bus 68. This combination of charging toward a final voltage of 12 volts, and clamping when the level reaches a preselected lower voltage, such as 5 volts, results in an approximately linear operation during the charging process. In a similar process, when the voltage at the non-inverting input terminal of amplifier 60 falls below the voltage at the inverting input terminal, the amplifier 60 output is switched to near zero volts and the capacitor begins to discharge towards zero volts.

The inverting input terminal of differential amplifier 60 is connected to a junction point of a voltage divider comprising resistors 68 and 70 which are serially connected between the positive 12 volt bus 62 and common or negative bus 25. The values of the resistors 68 and 70 are chosen to maintain the voltage level of the inverting input terminal at approximately one-half the voltage on bus 62 or about 6 volts. The non-inverting input terminal of amplifier 60 is connected through a resistor 72 to one terminal of a switch 74 which, in the illustrative embodiment, represents the water pressure switch 8 of FIG. 1 and is so arranged as to close when water pressure is less than the selected minimum value, e.g., 30 psi, and to open when water pressure is above a selected maximum value, e.g., 60 psi. A second terminal of switch 74 is connected to the voltage bus 62. The resistor 72 and a capacitor 76 form a noise filter at the non-inverting input terminal of amplifier 60. Thus the output of differential amplifier 60 goes high shortly after the pressure switch 74 closes, and low shortly after it opens with the time delay being set by the values of resistor 72 and capacitor 76. A resistor divider comprised of resistors 78 and 80 is connected between the output terminal of amplifier 60 and negative bus 25 to provide an input signal to the microcontroller 42 whenever amplifier 60 is switched. The noise filter provides de-bounced pressure switch closure and opening signals to the microcontroller via amplifier 60 and resistor divider 78, 80.

If the frequency of the excitation applied to motor 40 is allowed to increase significantly above motor speed, slip will become too high, torque will decrease and the motor may stall and draw excessive current. The present invention overcomes this problem by reducing frequency as a function of motor current.

A signal proportional to motor or power bridge current is provided by the resistive shunt 29 to a differential amplifier 82 via input resistors 84 and 86 connected from opposite ends of shunt 29 to the inverting and non-inverting input terminals, respectively, of amplifier 82. The ratio of the magnitude of a feedback resistor 88 (connected between the output terminal of amplifier 82 and its inverting input terminal) to the magnitude of the input resistor 84 is used to set the gain of amplifier stage 82. The output (or current amplitude) of amplifier 82 is compared to a reference value supplied from the microcontroller 42 by a differential amplifier 90. When the current in the power bridge is higher than the current represented by the reference value, the amplifier 90 will switch so that its output terminal is pulled low. Since the output terminal of amplifier 90 is connected through a diode 92 and a resistor 94 to capacitor 58, the capacitor 58 will be discharged by current flow through resistor 94 and diode 92 to amplifier 90. Resistor 94 is chosen to be smaller in magnitude than charging resistor 64 to ensure that when an overcurrent occurs, the frequency of the power supplied to motor 40 is reduced. As a further feature, the microcontroller 42 can also be programmed to reduce the charge on the capacitor 58 through a diode 96 connected between an output of microcontroller 42 and resistor 94.

As is well known in the induction motor art, if the frequency of the excitation voltage applied to the motor is reduced faster than the motor can slow, the motor will begin to operate as an induction generator transforming kinetic energy to electrical energy. However, since the diode bridge comprising diodes 16–22 cannot handle reverse power, the power generated by the motor results in a continually increasing voltage on the bus capacitor 26, and if allowed to continue may raise the voltage level of the bus to a level high enough to damage the power switches 28–38 of the inverter. To prevent such an event from occurring, the system includes a mechanism for holding or increasing excitation frequency if bus voltage rises above some selected level. In particular, a zener diode 98 and a resistor 100 are serially connected between positive bus 24 and capacitor 58. The voltage rating of the zener diode 98 is chosen to provide a reasonable margin of safety between the maximum allowed value of voltage on bus 24 and the peak voltage rating of the power circuit components 28–38. When the bus 24 voltage exceeds the value selected for the zener diode 98, the current through the diode 98 and resistor 100 provides a charging current to capacitor 58 increasing the frequency of the excitation supplied to the motor 40 and transforming the motor operation from generation to motoring. This system thus forces the deceleration rate to be limited to the rate at which the load (e.g., the pump) on the motor can absorb the kinetic energy.

As has been discussed above, in a residential water system supplied by a dedicated pump, a water pressure sensor is employed to switch the pump "ON" and "OFF" in order to maintain the pressure within the residence within specified limits. The difference between the upper and lower pressure limits is often referred to as a hysteresis band. In a typical system, the upper limit may be set at 60 psi and the lower limit at 40 psi. This results in a hysteresis band of 20 psi. In such a system, when the residential water pressure drops to 40 psi, the pressure switch closes and applies energization to the motor driving the water pump. In presently available pump systems, the pressure switch, when it closes, connects the two terminals of a single phase induction motor to the 60 Hz power line and the motor develops a torque which starts at some initial low value and increases as the motor speed increases. Eventually, the motor will reach a speed of about 3500 RPM and the pump will continue to run until the pressure reaches 60 psi. At this point, the pressure switch opens disconnecting the pump motor from the AC power line.

In order to provide some water storage within the residential system and to limit the frequency of motor restarts, the water storage tank 5 is included within the water system. The storage tank may contain a bladder which compresses a spring as it inflates or a separate air bag which can be inflated to provide a spring constant. The spring or air bag may be chosen such that 60 psi is required in the bladder to completely compress the spring or air bag with the pressure in the bladder dropping to about 40 psi when approximately 20 gallons of water has been removed from the bladder. Thus, when the pressure reaches the lower point of 40 psi and the pump is started, about 20 gallons of water is required to refill the tank and reach a pressure of 60 psi assuming no water is being consumed within the residence connected to the tank. A typical pump will supply a flow rate of between 10 and 20 gallons per minute depending upon the well depth and the system pressure at the top of the well. Accordingly, when the pump is started in the typical system, the pump must run for at least one minute after reaching top speed in order to refill the tank. Once the pump has stopped running, it will not be required to restart until 20 gallons of water has been removed from the tank. With such an arrangement, the motor is assured some rest period between restarts. However, in order to ensure that the motor is guaranteed some rest period, the system water pressure must be allowed to fluctuate over the above described 20 psi hysteresis band or more. Such fluctuation is most noticeable when a person is taking a shower where the changes in water pressure resulting from commode flushing and other large volume changes result in water temperature and shower head flow variation. The hysteresis band controlling the limits of the fluctuation is generally adjustable by the pump owner but may lead to an overheated motor if the hysteresis band between the upper and lower pressure limits is set to too narrow a range. Some commercially available protection devices for such motors include systems for prohibiting too frequent restarts.

In an ideal pumping system, the motor speed will be controlled such that the pump output flow rate would be equal to the flow demand so as to maintain system water pressure without the need for a storage tank. However, elimination of the storage tank presents formidable control problems. For example, because of the incompressibility of water, the pressure would drop substantially during the period when the pump is being accelerated from rest to a speed necessary to develop sufficient pressure to supply the demand. Thus, the ideal system could employ a resilient, although smaller, storage tank where the storage volume of the tank is dependent upon the time required to accelerate the pump from a rest state to the speed where it can develop sufficient pressure to supply the system demands and replenish the water removed from the tank. Thus, in the ideal system, it becomes important to accelerate the pump motor to its operating speed in a minimum amount of time.

Expensive, high performance drives are capable of accelerating motors in minimum time intervals by using tachometers in a slip regulation scheme so as to allow the motor to operate at close to its maximum torque point by constantly adjusting the frequency of excitation applied to the motor. However, in presently available variable speed induction motor applications where system cost is a critical factor, the tachometer is often eliminated and acceleration performance sacrificed by using an open loop control or frequency where the frequency is increased or decreased at a relatively slow rate to ensure that the motor is never forced to operate at slips greater than the value corresponding to the pullout torque. When these latter types of systems are applied to a water pumping arrangement, the induction motor is started by applying power at a frequency of 60 Hz with the motor at rest causing a considerable in rush of current to the motor. As the motor accelerates, the current drops such that the current level is at or below the rated value when rated speed is reached. With such a starting scheme, the motor reaches a speed where water is being supplied to the system within a few seconds thus preventing the system pressure level from falling much below the minimum level set on the pressure switch. However, because of the large currents which occurred during starting and the associated heating of the windings which is proportional to the square of the current magnitude, the motor cannot be started frequently without overheating. For example, if the hysteresis band is set to as small as 10 psi, the motor would likely be started too frequently and may eventually fail due to overtemperature. One of the advantages of using a variable frequency control of the excitation applied to the motor is that the motor can be started without the excessive starting currents associated with the above described fixed frequency system. If excitation is applied at a frequency equal to the slip frequency at rated torque, the motor will develop a torque equal to the rated torque with a corresponding current also equal to the rated current. If the frequency is then increased at a very slow rate, the motor will continue to accelerate without the current exceeding the rated level. Thus, the motor could be started frequently with this type of control without overheating. However, since the frequency must be increased at a slow rate in order to be certain that the frequency does not become excessive, the water pressure variation cannot be maintained to a suitable low level because it takes too long for the motor to accelerate to the speed necessary for supplying water to the system.

The above problem of inability to maintain system water pressure can be overcome by accelerating the motor at a much faster rate. If motor current increases with slip in a monotonic manner, the motor current can be considered to be a single valued non-linear function of speed. Thus, when starting with a variable frequency controller, if the rate of increase and frequency is constrained by the current magnitude, the motor can be accelerated at a constant torque.

Referring again to FIG. 2, when the pressure switch 74 is closed, 12 volts is applied to the noise filter combination of resistor 72 and capacitor 76. The time constant of this RC combination is chosen large enough to suppress noise but sufficiently small that it has no significant influence upon the transient operation of the circuit. Thus, the voltage on capacitor 76 is greater than the voltage at the midpoint of resistors 68 and 70. As a result, the non-inverting input of amplifier 60 is greater than that of the inverting input and the amplifier output voltage transitions to 12 volts. The capacitor 58 begins to charge towards the 12 volt output of amplifier 60. The microcontroller 42 converts the voltage on capacitor 58 to a corresponding frequency and generates the pulse width modulation gating signals that are coupled to the IGBT gate driver circuit 44. The gate driver circuit converts the PWM signals to appropriate values for application to the gate terminals of each of the switching devices 28–38. As the switching devices 28–38 are gated into and out of conduction, the DC voltage appearing across DC bus 14 and 16 is converted to a three-phase voltage for application to the terminals of motor 40. As the current in motor 40 begins to increase, the current through the current sensing resistor 29 increases in direct proportion. The voltage developed across the sensing resistor 29 is amplified by differential amplifier 82 and compared to a desired current level provided by the microcontroller 42 in the differential amplifier 90. So long as the motor current detected by sensor 29 is less than the reference level established by microcontroller 42, the output of amplifier 90 is positive and the diode 92 is reverse biased. However, should the current in the motor 40 exceed the desired level, the output developed by amplifier 90 will go to about zero volts, forward biasing the diode 92 and allowing current to be removed from the capacitor 58 through the series resistor 94 and diode 92. Since the frequency of the excitation applied to the motor is directly proportional to the voltage on capacitor 58, the result will be that the frequency of the excitation will be reduced as the capacitor is discharged. As the motor excitation frequency is reduced, motor slip is reduced and the current in the motor is also reduced. Accordingly, the system of FIG. 2 makes it possible to increase the motor excitation frequency at a rapid rate, for example, one second from zero to full speed, and minimizes the time required for the motor to attain the desired speed.

The system of FIG. 2 also includes the ability to rapidly decrease motor speed when the upper pressure setpoint is reached in order to minimize pressure overshoot. If the motor speed is reduced too rapidly however, the motor will operate as an induction generator, charging the link capacitor 26 to an increasing voltage level and run the risk of damaging the switching devices 28–38. The maximum rate at which the frequency can be lowered is limited by how rapidly the load driven by motor 40 is capable of slowing the motor. The zener diode 98 and resistor 100 operate as a bus overvoltage protection circuit connected to capacitor 58 so as to charge capacitor 58 if the voltage on bus 24 exceeds the zener breakover voltage. In operation, when the pressure switch 74 opens, capacitor 76 discharges through resistors 72 and 102 causing the output of amplifier 60 to transition to a near zero low value. The capacitor 58 begins to discharge through the resistor 64 thus providing a lower voltage input to the microcontroller 42 causing the frequency supplied by the microcontroller to drop and slow the motor. If the frequency decrease is rapid enough to result in the motor 40 operating in a power generation mode, the increase in voltage on bus 24 above the level set by the zener diode 98 will provide a charging current to capacitor 58 raising its voltage and causing the microcontroller 42 to increase the frequency applied to the motor. This results in an increase in the synchronous speed of the motor preventing it from operating as a generator.

Occasionally a pump will be unable to start because of sediment which causes sticking or binding forces that result in more torque than the motor is capable of developing at zero speed. If the motor is started by connecting it to a fixed frequency system, the torque at unity slip may be less than rated torque. If the motor is unable to accelerate, it will be subjected to a high current which may eventually cause it to fail from overtemperature. It is possible with variable frequency control to produce maximum motor torque at zero speed providing more torque to break the motor loose without excessive current. The control illustrated in FIG. 2 also provides the capability for agitating the motor and pump by reversing the phase sequence of power supplied to the motor if a stall is detected.

Using the system of FIG. 2, when the motor is started, the frequency of the motor increases as the speed increases to maintain the motor slip at a desired level. One method for determining whether the motor is accelerating properly is to check the excitation frequency several seconds after the start process has been initiated to determine whether or not the frequency is greater than some percentage of maximum frequency. For example, the frequency could be checked after about 15 seconds to determine if it was at least half the maximum frequency. If the frequency is less than the percentage of the maximum frequency, the motor can be assumed to be stalled. If a stall is detected, the microcontroller 42 can reverse the phase sequence of the pulse width modulation signals to cause the motor to be driven in a reverse direction. Further, the sequence of PWM signals can be alternately forwarded and reversed in order to agitate the motor and attempt to break the motor loose from a stall. Note that the process of reversing the sequence of PWM signals may require the microcontroller 42 to reduce the frequency to zero before each reversal. However, the software program implemented in the microcontroller can be adjusted to provide this function. Furthermore, the maximum frequency in the reverse sequence may be limited to the frequency which corresponds to the pullout torque value to ensure that maximum effort is available and to limit the maximum speed in the reverse direction to prevent bearing damage since the impellers in the pump may not provide sufficient water flow to support bearing lubrication in the reverse direction.

Figure 3:
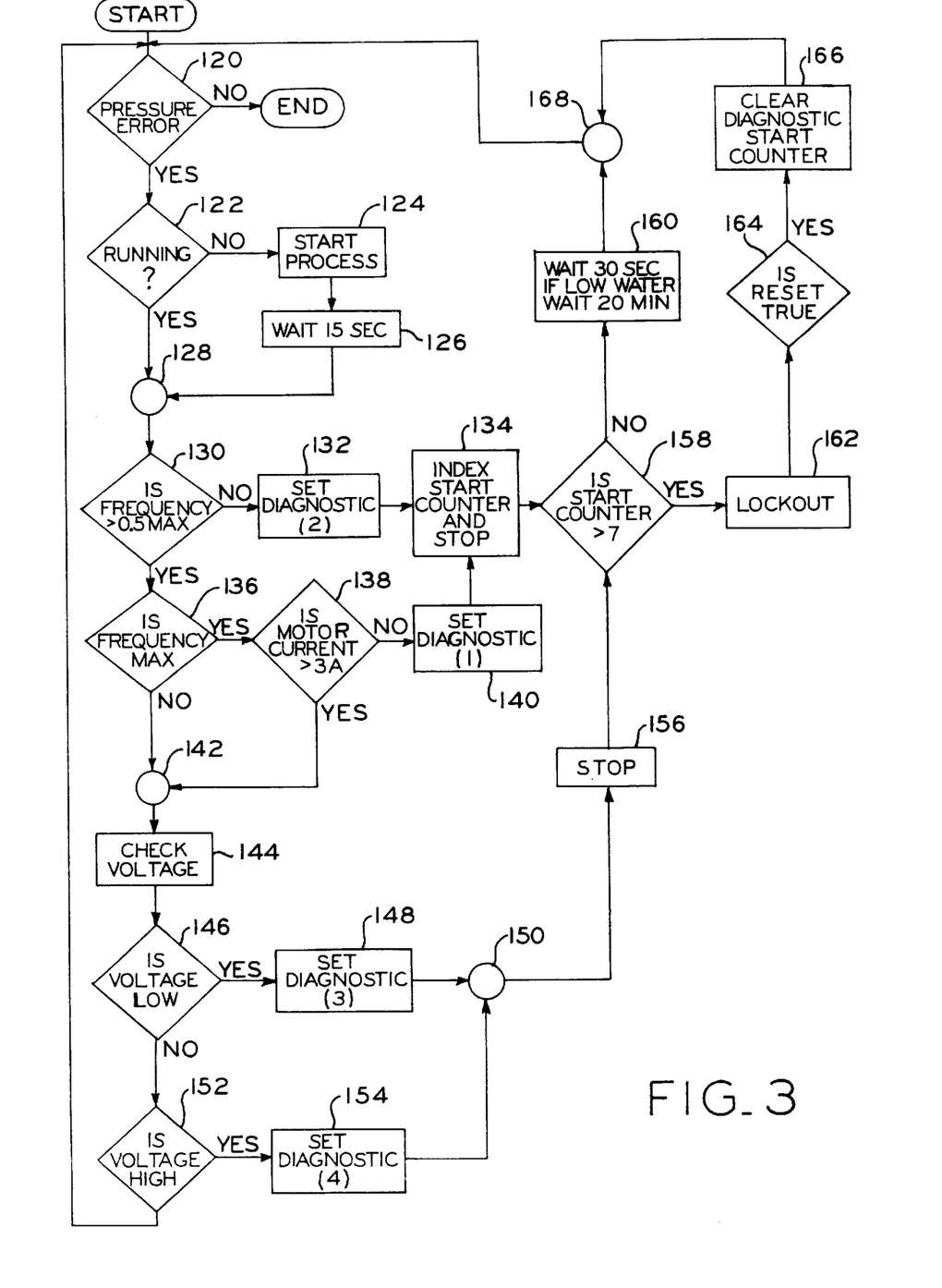
FIG. 3 is a flow chart illustrating a computer program for use with a microcontroller for implementing the control functions of the present invention.
Figure 4:
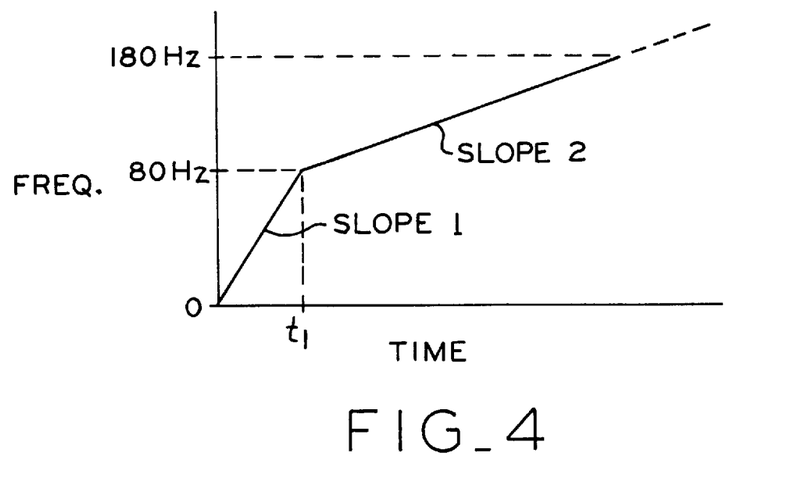
FIG. 4 is a frequency versus time graph illustrating operation of the pumping system in accordance with one teaching of the present invention.

Referring now to FIG. 3, there is shown a flow chart of one implementation of a software program for use in microcontroller 42 for controlling the system of FIG. 2 and implementing the concepts described above. The software program illustrated in FIG. 3 is executed on a periodic basis as is typical in a microcomputer. Typically, the program will run on a fixed time basis, for example, every five milliseconds. Each time the program is executed, processing begins with block 120 which tests the state of pressure switch 74 (voltage intermediate resistors 78,80 in FIG. 2) to see if the pump motor needs to be run in order to maintain water pressure in the system. If the pressure switch is not closed, i.e., the water pressure is between the selected upper and lower limits, the task is terminated. However, if the pressure is below the minimum setpoint, the pressure switch 74 will be closed and execution proceeds to block 122 to determine whether the motor has already been started. If the motor is not running, execution branches to a starting algorithm in block 124. The starting algorithm essentially creates the PWM output signals for the microcontroller beginning at zero frequency and increasing at an initial high rate as shown in FIG. 4. Note that for the initial time period, the frequency rate increases rapidly until the frequency reaches about 80 to 100 Hz. The point at which the frequency ends its first initial high rate is preferably the point at which the output pressure of a pump is sufficient to begin moving water into the storage tank, i.e., the pump output pressure is equal to the pressure head created by the depth of the pump and the pressure in the household system. Once the pump speed has reached this value, the algorithm causes the effective AC frequency applied to the motor to be increased at a slower rate until the pump has reached its maximum operating frequency or motor speed. Referring again to FIG. 3, once the start process has been initiated, a fixed time delay, for example, 15 seconds is implemented by block 126 before proceeding to decision block 130. Decision block 130 is provided to test for a stalled motor in the manner described above, i.e., the motor excitation frequency is compared to the maximum allowable excitation frequency to determine whether or not the frequency has been incremented up to about half of maximum allowable frequency. If the excitation frequency is less than half of the maximum allowable frequency, the motor is assumed to have been stalled and the program transitions over to a set diagnostic block 132. Block 132 increments a start counter 134 and initiates a stop command by removing the gate pulses from the switching devices 28–38 in the inverter circuit. The program then checks if the start counter has been incremented and if the number of starts is less than seven. If the number of starts is less than seven, block 158, the program initiates a 30 second delay, block 160, and then transitions back to the start point to reinitiate the program operation. Each time the program steps through the start counter 134, the counter is incremented until it reaches a pre-set number, for example, seven. If the counter reaches a count of seven and the motor is still detected to be in a stalled condition, the program transitions to a lockout block 162 and inhibits further restarts. The motor can, of course, be restarted by providing a power reset to the system and the microcontroller 42 responds by test the state of the reset in block 164. If reset has been commanded, the diagnostic start counter block 134 is reset, block 166, and the program is returned to the start point at block 120.

If at block 130 the motor is found to be running above half speed, the system is then checked to be certain that it is not attempting to pump a dry well caused by low water level caused by inlet water ports to the pump being below the water level. If the water level is low, the motor will be operating with virtually no load and the motor speed will be close to synchronous speed. Accordingly, the magnitude of current drawn by the motor will be less than one would expect for a loaded motor and will exhibit a very low power factor. Accordingly, if the well water level drops below the inlet ports on the pump, the pressure switch will remain in a closed condition causing the motor 40 to continue to run in an attempt to raise the system pressure level and will eventually reach the maximum rotational speed corresponding to the maximum excitation frequency.

Referring again to FIG. 2, the total current is detected by the current sensor 29 and is available at the output of the amplifier 82. The value of real current is detected by another sensing resistor RS located in the negative bus 25 between the rectifier circuit and the lower terminal of the capacitor 26. An amplifier 137 has its input terminals connected to opposite sides of the resistor RS through current limiting resistors 139 and 141. The gain of the amplifier 137 is set by the feedback resistor 143. The output signal from amplifier 137 represents the real component of current supplied by the electric power system. Both the signal from amplifier 88 and the signal from amplifier 137 is supplied to the microcontroller 42. Within the microcontroller 42, the value of real current is divided by the value of total current to obtain the power factor.

Returning again to FIG. 3, if the system detects that the output frequency is at its maximum value in block 136, block 138 then checks to determine if motor current is greater than some preselected value such as, for example, 3 amps. If motor current is less than the preselected value, then it is assumed that the motor is unloaded and that the pump is not pumping water so that the block 138 provides a signal to the set diagnostic block 140. The diagnostic block 140 triggers an alarm and indexes the start counter block 134. The program thus recycles back to its beginning. Note however that in the event that the pump is not pumping water, the block 160 can be set to either wait 30 seconds for a restart, or, in the condition detected by diagnostic block 140, can implement a longer pause, such as, for example, 20 minutes to allow the well to recover from a low water condition.

Returning again to block 138, if motor current is determined to be greater than the 3 amp level, the program continues down to block 144 to check for voltage level on the DC bus. If the voltage is determined to be low, block 146, the program sets diagnostic block 148 and implements a stop through block 156. The start counter block 134 is not implemented by this loop so that the system waits 30 seconds and proceeds with a repeat execution. Preferably, if either high or low voltage is detected to be true, the start process block 124 is inhibited and execution proceeds directly to block 130. The check for high voltage is essentially the same as the check for low voltage and is implemented in block 152. Again, if the voltage is too high on bus 24, the diagnostic block 154 is set and implements a stop function through block 156. If the voltage is not too high, the program loops back to the start block 120 and repeats at its normal timed interval.

It will be apparent to a person of ordinary skill in the art of electronic controls that the analog circuit illustrated in FIG. 2 for generation of the ramp voltage waveform, i.e., the voltage on capacitor 58, is easily implemented in a microprocessor program. More particularly, the microprocessor 42 can be programmed to generate the ramp frequency profile of FIG. 4 in response to an "ON" command from the pressure switch 8. Such a program is readily implemented using counter functions available in a conventional microcomputer. Use of the microcomputer 42 to generate the incrementally increasing frequency applied to the motor 40 is actually preferred since the microcomputer can increment or decrement frequency in selected steps, e.g., by about 0.1 Hz each time the processor steps through the frequency generating routine, typically about every 5 milliseconds or 200 times per second. Using the microcomputer 42 to increment and decrement frequency enables more precise control of motor 40 since motor current can be checked at each increment, i.e., current can be monitored and compared after each 0.1 Hz increment in AC power frequency. The microcomputer can also decrement the frequency by the same amount or by a different amount, such as a multiple or fraction of the incrementing amount. Changing the rate of frequency increment in the microcomputer is also easily implemented using conventional counter functions. As discussed with regard to FIG. 4., it is generally desirable to accelerate the pump rapidly to the speed at which water begins to be pumped from the well. Once water is being pumped, further speed increases may only be such as to maintain system pressure or to refill the tank 5 at a desired rate. The initial rate of increase of frequency of the power applied to the motor is preferably set at a rate which will maintain a substantially constant torque. Such a rate is determined from motor characteristics and controlled by monitoring of motor current such that the rate of frequency increase is as high as possible without causing motor current to exceed its pullout torque value. As described with regard to FIG. 5, the microcontroller program enables microcomputer implementation of this frequency control function.

One advantage of the microcomputer control in a water pump system is that the motor 40 can be run at a speed which will exactly supply the volume of water being drawn from the system thereby allowing pressure to be maintained substantially constant. More particularly, the size of the storage tank 5 can be reduced to a size necessary to supply water at the nominal system pressure only for the time required to accelerate the pump and motor 40 to operating speed. Rather than a conventional 60 gallon tank, the tank 5 may be reduced to perhaps five gallons. Further, the pressure switch 8 may be a simpler switch having a narrow hysteresis band of about two psi or some similar small value so that system pressure does not vary substantially as in current systems.

While the invention has been described in what is presently considered to be a preferred embodiment, many variations and modifications will become apparent to those skilled in the art. Accordingly, it is intended that the invention not be limited to the specific illustrative embodiment but be interpreted within the full spirit and scope of the appended claims.

What is claimed is:

1. A method for controlling torque of an alternating current (AC) electric motor driving a variable load in a system including a controllable, variable frequency source of AC electric power coupled to the motor, the method comprising the steps of:
    applying AC power to the motor from the variable frequency source while incrementing the frequency of the AC power from about zero Hertz to a first preselected frequency at a relatively fast rate;
    incrementing the AC power frequency at a second slower rate above the first preselected frequency; and
    during each step of applying and incrementing the AC power frequency, monitoring and comparing current in the motor to a predetermined magnitude and, if motor current exceeds the predetermined magnitude, decrementing the AC power frequency by a selected increment.

2. The method of claim 1 and including the further step of adaptively setting the first preselected frequency as a function of the first frequency at which motor current exceeds the predetermined magnitude.

3. The method of claim 1 wherein the relatively fast rate is selected to accelerate the motor at a substantially constant torque.

4. The method of claim 1 and including the further steps of comparing AC power frequency to a predetermined minimum frequency at a selected time after the step of applying AC power to the motor and, if AC power frequency is less than the predetermined frequency; momentarily reversing the phase of the AC power to cause the motor to be driven in a reverse direction; and thereafter
    repeating the steps of applying and increasing to restart the motor in a forward direction.

5. The method of claim 1 and including the further step of comparing the AC power frequency to a preselected minimum frequency a predetermined time interval after initial application of AC power to the motor for determining a stalled status of the motor when the AC power frequency is less than the preselected minimum frequency.

6. The method of claim 5 and including the further steps of initiating a motor restart sequence by repeating the steps of applying AC power and increasing AC power frequency until the stalled status is overcome or a selected number of restart sequences have been attempted.

7. The method of claim 1 wherein the motor is connected for driving a water pump for pumping water from a well into a pressurizable storage tank having a pressure sensor for providing a first signal when water pressure in the tank reaches a first selected upper limit and a second signal when water pressure in the tank reaches a second lower limit, the method including the further step of removing AC power from the motor in response to the first signal.

8. The method of claim 7 wherein the variable frequency source comprises an electronic inverter circuit coupled to a source of DC electric power, and wherein the step of removing AC power includes the step of monitoring the magnitude of DC voltage at the inverter and limiting the rate of removing AC power to a rate which does not increase the DC voltage above a selected value.

9. The method of claim 8 and including the step of removing AC power from the motor when the DC voltage is less than a selected minimum value.

10. The method of claim 7 wherein the first preselected frequency corresponds to a motor speed at which the pump overcomes the head pressure at the pump.

11. The method of claim 1 wherein the AC power frequency is increased above said first preselected frequency to a maximum selected frequency and including the further step of comparing motor current at the maximum frequency to a predetermined minimum motor current value for identifying an unloaded motor when motor current is less than the minimum motor current value.

12. The method of claim 11 and including the step of removing AC power from the motor when motor current is less than the predetermined minimum value at the maximum frequency.

13. A water supply system comprising:
    a water pump and electric motor assembly for placement in a water source in which the pump comprises a centrifugal pump having a plurality of stacked impellers on a common shaft and the motor comprises a three-phase, AC induction motor having a rotor adapted for rotation at speeds up to about 10,800 revolutions per minute, the rotor having a shaft connected for direct drive of the pump impeller shaft;

a rectifier assembly having input terminals for connection to a source of AC electric power and having a pair of output terminals for providing a rectified DC output onto a pair of relatively positive and relatively negative voltage busses;

a filter capacitor connected across the pair of voltage busses;

a three-phase electric power inverter connected to the pair of voltage busses and including a plurality of electronically controllable switching devices for producing a controlled frequency, three-phase power output at output terminals thereof, the inverter output terminals being connected to corresponding input terminals of said motors;

a microcontroller for developing switching signals for application to the controllable switching devices in the inverter, the microcontroller including a microcomputer operating a program for computing the start and duration of the switching signals;

a pressure switch coupled to the water system and adapted for producing a first signal when water pressure is at a first upper limit value and for producing a second signal when water pressure is at a second lower limit value;

apparatus for producing an increasing DC voltage in response to the second signal, said microcontroller being coupled to receive said increasing DC voltage and for generating said switching signals at a frequency proportional thereto;

current sensing means coupled for providing a current signal representative of motor current; and mean is responsive to said current signal for varying said increasing DC voltage in a manner to control the frequency of said switching signals to prevent said motor current from exceeding a selected maximum value.

14. A method for controlling torque of an alternating current (AC) electric motor driving a variable load in a system including a controllable, variable frequency source of AC electric power coupled to the motor, the method comprising the steps of:

applying AC power to the motor from the variable frequency source while incrementing the frequency of the AC power from about zero Hertz at a relatively fast rate; and during the step of applying and incrementing the AC power frequency, monitoring and comparing current in the motor to a predetermined magnitude and, if current exceeds the predetermined magnitude, decrementing the AC power frequency until motor current is less than the predetermined magnitude, and thereafter repeating the steps of applying, incrementing, monitoring and comparing.

15. The method of claim 14 wherein the relatively fast rate is selected to accelerate the motor at a substantially constant torque.

16. The method of claim 14 and including the further steps of comparing AC power frequency to a predetermined minimum frequency at a selected time after the step of applying AC power to the motor and, if AC power frequency is less than the predetermined frequency; momentarily reversing the phase of the AC power to cause the motor to be driven in a reverse direction; and thereafter repeating the steps of applying and increasing to restart the motor in a forward direction.

17. The method of claim 14 and including the further step of comparing the AC power frequency to a preselected minimum frequency a predetermined time interval after initial application of AC power to the motor for determining a stalled status of the motor when the AC power frequency is less than the preselected minimum frequency.

18. The method of claim 17 and including the further steps of initiating a motor restart sequence by repeating the steps of applying AC power and increasing AC power frequency until the stalled status is overcome or a selected number of restart sequences have been attempted.

19. The method of claim 14 wherein the motor is connected for driving a water pump for pumping water from a well into a pressurizable storage tank having a pressure sensor for providing a first signal when water pressure in the tank reaches a first selected upper limit and a second signal when water pressure in the tank reaches a second lower limit, the method including the further step of removing AC power from the motor in response to the first signal.

20. The method of claim 19 wherein the variable frequency source comprises an electronic inverter circuit coupled to a source of DC electric power, and wherein the step of removing AC power includes the step of monitoring the magnitude of DC voltage at the inverter and limiting the rate of removing AC power to a rate which does not increase the DC voltage above a selected value.

21. The method of claim 20 and including the step of removing AC power from the motor when the DC voltage is less than a selected minimum value.

22. The method of claim 19 wherein the first preselected frequency corresponds to a motor speed at which the pump overcomes the head pressure at the pump.

23. The method of claim 14 wherein the AC power frequency is increased above said first preselected frequency to a maximum selected frequency and including the further step of comparing motor current at the maximum frequency to a predetermined minimum motor current value for identifying an unloaded motor when motor current is less than the minimum motor current value.

24. The method of claim 23 and including the step of removing AC power from the motor when motor current is less than the predetermined minimum value at the maximum frequency.

25. The method of claim 14 and including the step of determining motor power factor for identifying an unloaded motor.

26. The method of claim 25 wherein the variable frequency source includes a fixed frequency source of electric power coupled to a rectifier circuit for developing DC power, the rectifier circuit coupled to a DC link for supplying the DC power to a controllable frequency inverter circuit, the step of determining power factor including the steps of measuring DC current supplied to the DC link from the rectifier circuit, measuring DC current supplied to the inverter circuit from the DC link and computing power factor as a ratio of DC current to the inverter to DC current supplied to the DC link.

* * * * *